(12) United States Patent
Uchida (10) Patent No.: US 7,872,513 B2
(45) Date of Patent: Jan. 18, 2011

(54) APPARATUS AND CIRCUIT INCLUDING LATCH CIRCUIT, AND METHOD OF CONTROLLING LATCH CIRCUIT

(75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 81 days.

(21) Appl. No.: 12/314,229

(22) Filed: Dec. 5, 2008

(65) Prior Publication Data

US 2009/0189662 A1 Jul. 30, 2009

(30) Foreign Application Priority Data

Jan. 28, 2008 (JP) .............................. 2008-015827

(51) Int. Cl.
*H03K 3/356* (2006.01)
(52) U.S. Cl. ...................... 327/203; 327/199
(58) Field of Classification Search .......... 327/199–203
See application file for complete search history.

(56) References Cited

U.S. PATENT DOCUMENTS

| | | | | |
|---|---|---|---|---|
| 5,032,783 A * | 7/1991 | Hwang et al. | ............... | 324/73.1 |
| 5,130,568 A * | 7/1992 | Miller et al. | ................. | 327/202 |
| 5,390,190 A * | 2/1995 | Nanda et al. | ................. | 714/727 |
| 5,491,699 A * | 2/1996 | Scheuermann et al. | ...... | 714/724 |
| 6,073,260 A * | 6/2000 | Kurita | ......................... | 714/724 |
| 6,289,477 B1 * | 9/2001 | Gunadisastra | ............... | 714/724 |
| 6,606,720 B1 * | 8/2003 | Naffziger | ..................... | 714/726 |
| 7,411,413 B2 | 8/2008 | Shimazaki et al. | | |
| 2004/0250165 A1 | 12/2004 | Tanizaki | | |
| 2006/0273837 A1 | 12/2006 | Shimazaki et al. | | |

FOREIGN PATENT DOCUMENTS

| | | |
|---|---|---|
| JP | 2001-141791 | 5/2001 |
| JP | 2003-43114 | 2/2003 |
| JP | 2004-280926 | 10/2004 |
| JP | 2005-3556 | 1/2005 |
| JP | 2006-339948 | 12/2006 |

OTHER PUBLICATIONS

Japanese Office Action issued in JP 2008-015827 dated Dec. 8, 2008 with partial English translation.

* cited by examiner

*Primary Examiner*—Lincoln Donovan
*Assistant Examiner*—Ryan C Jager
(74) *Attorney, Agent, or Firm*—McGinn IP Law Group, PLLC (57) ABSTRACT

An apparatus includes a first selector which selects a test data during a first operation mode, and selects a first input data during a second operation mode, a first latch circuit which latches an output signal of the first selector according to a first clock signal, a second selector which selects one from a second input data and an output signal of the first latch circuit, and a second latch circuit which latches the second input data sent from the second selector according to a second clock signal during the second operation mode, and passes through the output signal of the first latch circuit sent from the second selector during the first operation mode.

15 Claims, 11 Drawing Sheets

| MODE | OUTPUT OF SELECTOR 110 | OUTPUT OF LATCH CIRCUIT 120 | OUTPUT OF SELECTOR 130 | OUTPUT OF LATCH CIRCUIT 140 |
|---|---|---|---|---|
| FIRST OPERATION MODE | SIN | Q (SIN) | Q (SIN) | SOUT (Q) |
| SECOND OPERATION MODE | D1 | Q(D1) | D2 | Q2(D2) |
| THIRD OPERATION MODE | D1 | D1(D1) | — | — |

| MODE | SMODE | DMODE | SMB |
|---|---|---|---|
| NORMAL OPERATION | 1 | 0 | 0 |
| SCAN SHIFT | 0 | 0 | 1 |
| DEGRADATION DETECTION | 1 | 1 | 0 |
| INHIBITION | 0 | 1 | 1 |

Fig. 5

| CLK1 | ctr1 | ctr2 | CLK2 |
|---|---|---|---|
| CKT1 | SMODE,SMB,DMODE | CKB2,CKT2 | CKT2 |

Fig. 6

| MODE | OUTPUT OF SELECTOR 210 | OUTPUT OF LATCH CIRCUIT 220 | OUTPUT OF SELECTOR 230 | OUTPUT OF LATCH CIRCUIT 240 |
|---|---|---|---|---|
| NORMAL OPERATION MODE | D1 | Q(D1) | — | — |
| SCAN SHIFT | SIN | Q(SIN) | Q(SIN) | SOUT($\bar{Q}$) |
| DEGRADATION DETECTION | D1 | D1(D1) | D2 | Q2(D2) |

| MODE | OUTPUT OF SELECTOR | OUTPUT OF LATCH CIRCUIT | OUTPUT OF SELECTOR | OUTPUT OF LATCH CIRCUIT |
|---|---|---|---|---|
| DEGRADATION DETECTION | D | Q(D) | D | Q2(D) |

| MODE | OUTPUT OF SELECTOR 210 | OUTPUT OF LATCH CIRCUIT 220 | OUTPUT OF SELECTOR 330 | OUTPUT OF LATCH CIRCUIT 240 |
|---|---|---|---|---|
| NORMAL OPERATION | D1 | Q (D1) | — | — |
| SCAN SHIFT | SIN | Q(SIN) | $\overline{Q}$(SIN) | SOUT (Q) |
| DEGRADATION DETECTION | D1 | Q(D1) | D2(=D1) | Q2(D2) |

Fig. 12

APPARATUS AND CIRCUIT INCLUDING LATCH CIRCUIT, AND METHOD OF CONTROLLING LATCH CIRCUIT

INCORPORATION BY REFERENCE

This application is based upon and claims the benefit of priority from Japanese patent application No. 2008-015827, filed on Jan. 28, 2008, the disclosure of which is incorporated herein in its entirety by reference.

BACKGROUND OF THE INVENTION

1. Field of the Invention

The present invention relates to a latch circuit, and more particularly, to a pulse latch circuit.

2. Description of Related Art

In order to detect deterioration of a circuit, which is tested for detecting the deterioration, of an LSI (Large Scale Integrated Circuit), the test is performed by inserting in parallel two flip-flop (FF) circuits to an output bus of the circuit to be tested. A delay amount of each of the two flip-flop circuits is different with each other. The two FF circuits may latch an output data of the circuit to be tested when the deterioration of the circuit to be tested is small. However, an FF circuit including a larger delay may not latch the output data of the circuit to be tested when the deterioration of the circuit to be tested becomes large.

In recent years, regarding the LSI, a pulse latch circuit has been substituted for the FF circuit for increasing an operation speed of the LSI. The pulse latch circuit operates according to a pulse-shaped clock signal. Regarding the pulse latch circuit, an improvement technique is proposed from various viewpoints.

For example, in patent document 1 (Japanese Patent Laid-Open No. 2006-339948), a technique which reduces a power consumption of the pulse latch circuit is disclosed. This technique will be described with reference to FIG. 12.

Figure 12:
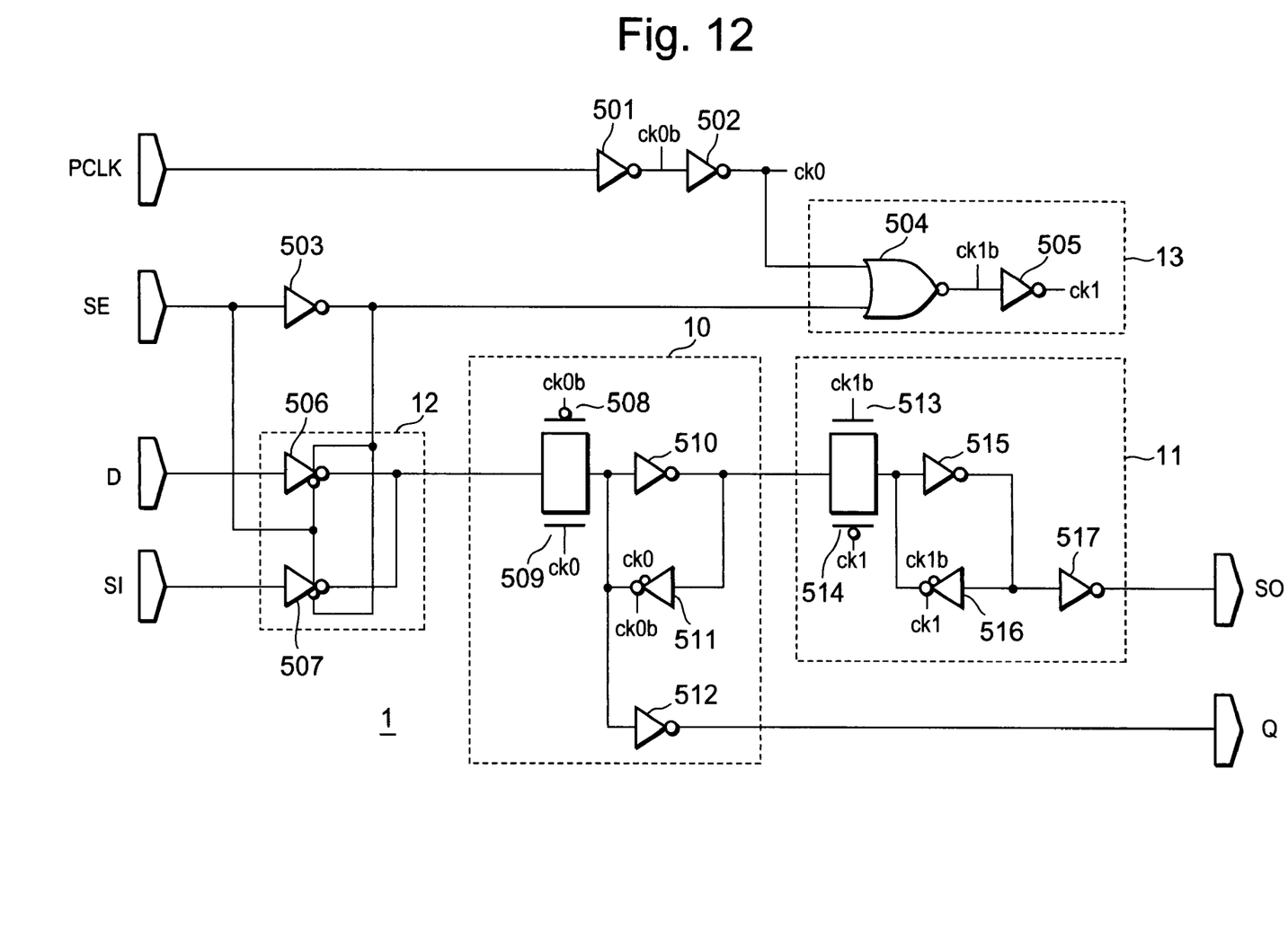
FIG. 12 is a diagram showing a related art.

FIG. 12 shows a pulse latch circuit 1 to which the technique of the patent document 1 is applied. The pulse latch circuit 1 includes a latch circuit 10, a latch circuit 11, a selector 12, and a latch control circuit 13. The selector 12 transmits selectively input data D and scan input data SI for a scan shift to the latch circuit 10 according to a scan enable signal SE. The latch circuit 10 latches an output of the selector 12 according to the pulse shaped clock signal (hereinafter, a pulse clock signal) PCLK. The latch circuit 11 passes through a signal during when the pulse clock signal PCLK is Low. An operation of the latch circuit 11 is controlled by the latch control circuit 13. The pulse clock signal PCLK is provided to the latch circuit 11 for operating the latch circuit 11 during when the scan enable signal SE is high. The pulse clock signal PCLK is not provided to the latch circuit 11 during when the scan enable signal SE is low. Therefore, the latch circuit 11 stops the operation.

The latch circuit 11 passes through the scan input data SI which is latched by the latch circuit 10 when the scan enable signal SE is high, i.e., a scan shift operation mode. The latched scan input data SI, which is passed through the latch circuit 11, is outputted from the latch circuit 11 as a scan output data SO.

On the other hand, the latch circuit 10 latches the input data D, and outputs the latched input data D as an output data Q when the scan enable signal SE is Low, i.e., a normal operation mode. During the normal operation mode, the scan shift operation is not performed. Also, the latch circuit 11 does not operate since the supply of the pulse clock signal PCLK is stopped.

Since the operation of the latch circuit 11 is stopped at the time of the normal operation mode, the power consumption may be suppressed.

When the pulse latch circuit 1 is applied to detection of deterioration of the circuit to be tested of the LSI, for example, two pulse latch circuits 1 are inserted in parallel in an output bus of the circuit to be tested. Also, the pulse clock signals PCLK, the phase difference of each of PCLK is different from each other, are inputted into each of the two pulse latch circuits 1, and then the deterioration of the circuit to be tested is detected.

SUMMARY OF THE INVENTION

According to one exemplary aspect of the present invention, an apparatus includes a first selector which selects a test data during a first operation mode, and selects a first input data during a second operation mode, a first latch circuit which latches an output signal of the first selector according to a first clock signal, a second selector which selects one from a second input data and an output signal of the first latch circuit, and a second latch circuit which latches the second input data sent from the second selector according to a second clock signal during the second operation mode, and passes through the output signal of the first latch circuit sent from the second selector during the first operation mode.

According to another exemplary aspect of the present invention, a circuit includes a first selector which selects a test data during a first operation mode, and selects a first input data during a second operation mode, a first latch circuit which latches an output signal of the first selector according to a first clock signal, a second selector which selects one from a second input data and an output signal of the first latch circuit, and a second latch circuit which latches the second input data sent from the second selector according to a second clock signal during the second operation mode, and passes through the output signal of the first latch circuit sent from the second selector during the first operation mode.

According to another exemplary aspect of the present invention, a Method includes selecting a test data during a first operation mode, selecting a first input data during a second operation mode, latching a selected signal, the test data or the first input data, according to a first clock signal, selecting one from a second input data and the latched signal which is latched according to the first clock signal, latching the selected second input data according to a second clock signal during the second operation mode, and passing through the selected output signal of the first latch circuit during the first operation mode.

BRIEF DESCRIPTION OF THE DRAWINGS

Other exemplary aspects and advantages of the invention will be made more apparent by the following detailed description and the accompanying drawings, wherein.

DETAILED DESCRIPTION OF THE EXEMPLARY EMBODIMENTS

A circuit scale in the case of applying the pulse latch circuit 1 shown in FIG. 12 to deterioration detection of the tested circuit, is described. Since the pulse latch circuit 1 includes eight inverters, four clocked inverters, one NOR gate, and two transmission gates as shown in FIG. 12, the number of required transistors is 40.

Since two pulse latch circuits 1 are used in order to perform deterioration detection of the circuit to be tested, the number of required transistors becomes 80. Furthermore, since it is necessary to provide a circuit for generating two kinds of the pulse clock signals PCLK each of which includes a different phase for performing the deterioration detection, the number of transistors further increases.

In recent years, since miniaturization of electronic products, e.g., a mobile phone, etc., it is required to reduce the circuit scale of the LSI to be installed on the electronic products. In such a background, reduction of the circuit scale in the case of applying a pulse latch circuit to deterioration detection of the circuit to be tested is also required.

In the present invention, the circuit scale is reduced when applying a pulse latch circuit to deterioration detection of the circuit to be tested in an LSI.

Figure 1:
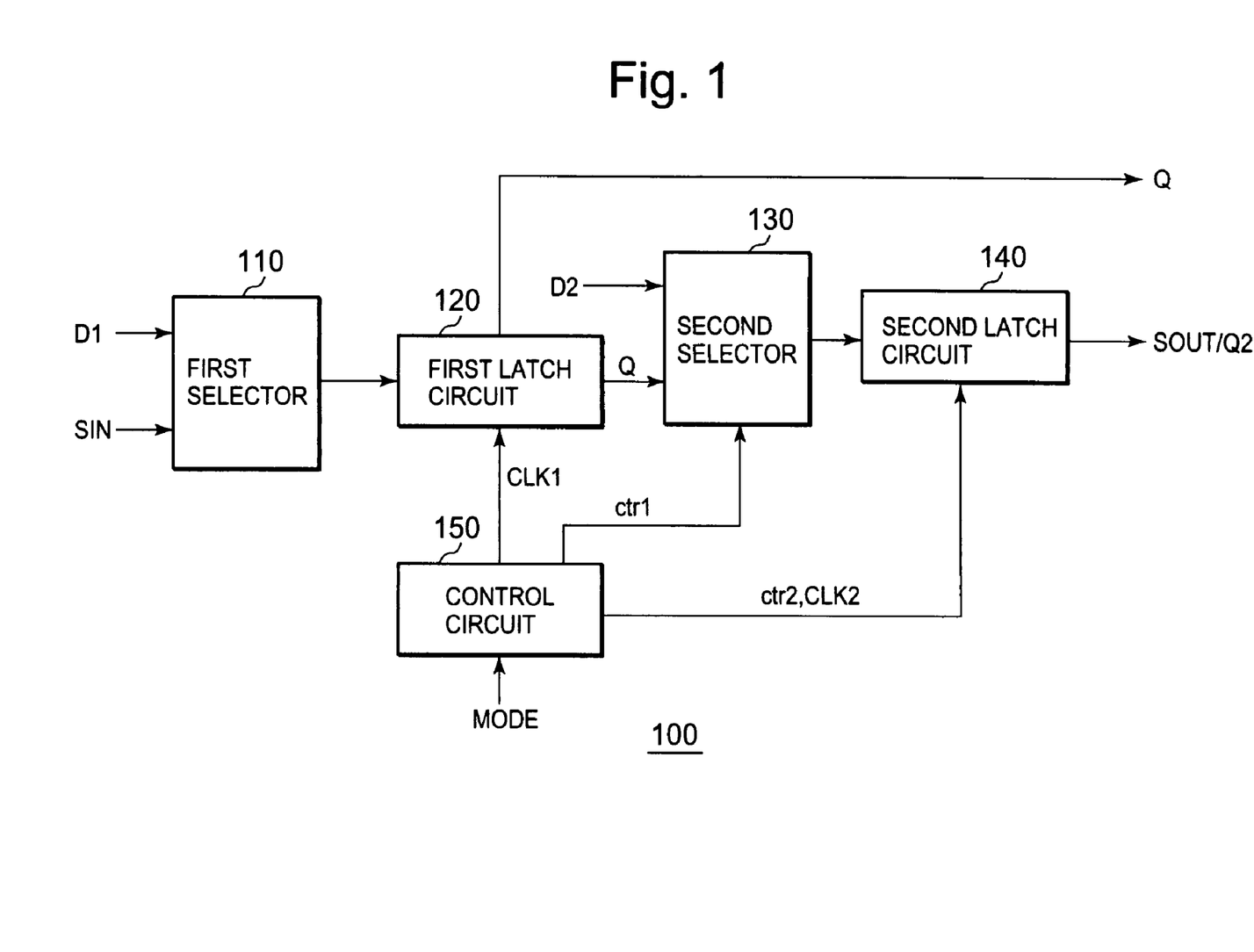
FIG. 1 is an exemplary block diagram of a pulse latch circuit of the present invention.

FIG. 1 is an exemplary diagram of a pulse latch circuit 100 of the present invention. The pulse latch circuit 100 includes a first selector 110, a first latch circuit 120, a second selector 130, a second latch circuit 140, and a control circuit 150. The pulse latch circuit 100 corresponds to at least three operation modes, that is, a first operation mode, a second operation mode, and a third operation mode. The first operation mode is hereafter called a "scan shift mode". The scan shift mode is a mode in which the scan shift is performed with a test pattern data, and the second operation mode and third operation mode will be mentioned later.

The first selector 110 outputs selectively input data D1 and a test pattern data SIN for the scan shift. The first selector 110 outputs the test pattern data SIN during the scan shift mode, and the first selector 110 outputs the first input data D1 during the second operation mode and third operation mode.

The first latch circuit 120 operates according to a first pulse clock CLK1. The first latch circuit 120 latches an output of the first selector 110 according to the first pulse clock CLK1. The first latch circuit 120 outputs a latch data Q. The first pulse clock CLK1 may be supplied from the control circuit 150, for example. However, it is not limited that the control circuit 150 provides the first pulse clock CLK1.

The second selector 130 is connected to the first latch circuit 120. The latch data Q of the first latch circuit 120 is inputted to the second selector 130. The second selector 130 includes a data input terminal which is not shown in FIG. 1. Data is inputted from the data input terminal. In order to distinguish from the input data D1, the data which is inputted from the input terminal of the second selector 130 may be called "input data D2". The second selector 130 may output selectively the second input data D2 and the latch data Q of the first latch circuit 120, to the second latch circuit 140.

The second latch circuit 140 operates with two states, which are a "latch state" and a "through state". In the latch state, a second pulse clock CLK2 is supplied to the second latch circuit 140. An output of the second selector 130 is latched according to the second pulse clock CLK2. The second latch circuit 140 outputs latch data Q2. The through state may mean a state that the second latch circuit 140 passes through the data which is inputted to the second latch circuit 140. In other words, during the through state, the second latch circuit 140 does not latch the data which is inputted to the second latch circuit 140.

The second selector 130 and the second latch circuit 140 are controlled by the control circuit 150. The second selector 130 is controlled by a first control signal "ctr1", and the second latch circuit 140 is controlled by a second control signal "ctr2".

The control circuit 150 receives an operation mode signal "MODE" which indicates any one of the three operation modes, and performs control as follows according to the operation mode corresponding to the operation mode signal "MODE".

1. MODE: First Operation Mode (Scan Shift Mode)

In this operation mode, the control circuit 150 outputs the first control signal ctr1, which makes the second selector 130 select the latch data Q. The control circuit 150 outputs the second control signal ctr2 which makes the second latch circuit 140 enter into the through state. Therefore, the latch data Q is outputted as scan output data SOUT from the second latch circuit 140 without being latched by the second latch circuit 140.

2. MODE: Second Operation Mode

In this operation mode, the control circuit 150 outputs the first control signal ctr1, which makes the second selector 130 select the second input data D2, to the second selector 130. The control circuit 150 provides the second pulse clock signal CLK2 to the second latch circuit 140. The second pulse clock signal CLK2 may be generated by adding a predetermined delay to the first pulse clock signal CLK1.

3. MODE: Third Operation Mode

In this operation mode, the control circuit 150 outputs the second control signal ctr2, which makes the second latch circuit 140 enter into the through state, to the second latch circuit 140.

Figure 2:
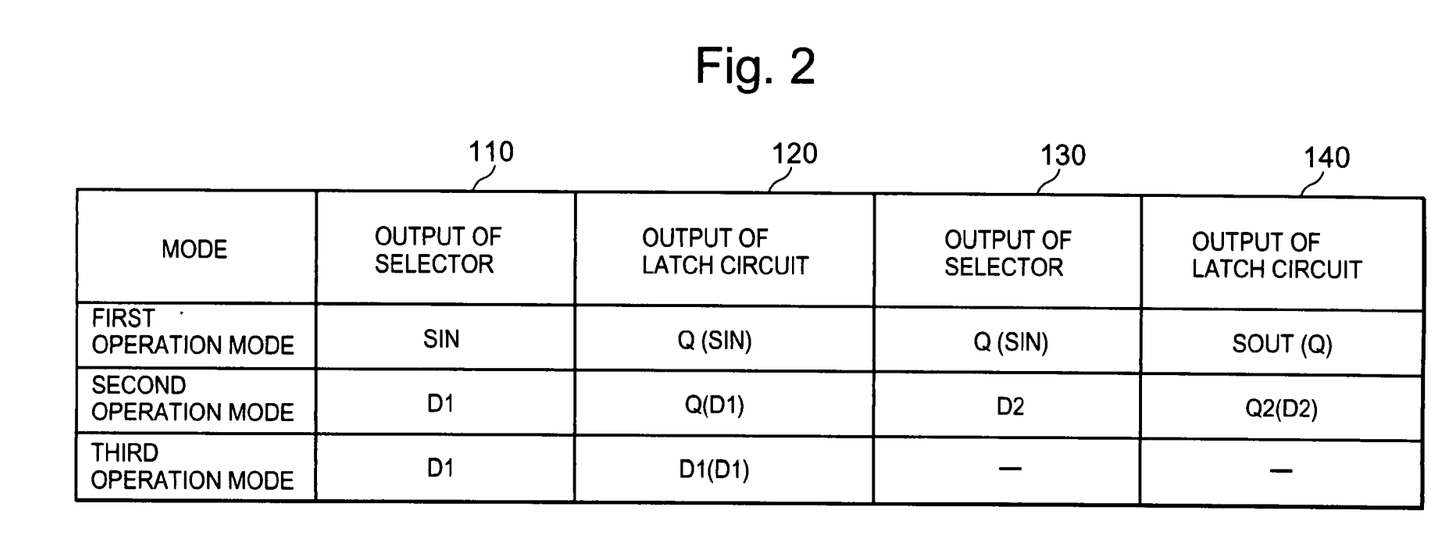
FIG. 2 is an exemplary table showing an exemplary operation mode of the present invention.

Referring to FIG. 2, each data which flows through the pulse latch circuit 100 will be described in each operation mode.

As shown in FIG. 2, the first input data D1 is outputted from the first selector 110 during the second or the third operation mode. The first input data D1 is latched by the first latch circuit 120 according to the first pulse clock CLK1, and the latch data Q is outputted from the first latch circuit 120.

An operation of the second selector 130 is controlled by the first control signal ctr1 from the control circuit 150. Regarding the control, the following three patterns are considerable. However, in the third operation mode, an output of the selector 130 and an output of the second latch circuit 140 may be any of the following three patterns. Hence, in FIG. 2, the output of the selector 130 and the output of the second latch circuit 140 are not specified about the third operation mode.

1. First Pattern: To output the latch data Q of the latch circuit 120.

In this case, the latch data Q outputted to the second latch circuit 140 from the second selector 130 is outputted from the second latch circuit 140 as the scan output data SOUT.

2. Second Pattern: To output the second input data D2 inputted from the data input terminal of the second selector 130.

In this case, the second input data D2 which is outputted to the second latch circuit 140 from the second selector 130 is also outputted from the second latch circuit 140 as the scan output data SOUT.

3. Third Pattern: To stop an output.

In this case, there is no input from the second selector 130 to the second latch circuit 140, and the second latch circuit 140 may be disabled.

In the third operation mode, by controlling according to the third pattern, a power consumption of the latch circuit 100 may be reduced.

In the third operation mode, the first input data D1 which is inputted into the first selector 110 is latched by the first latch circuit 120. This achieves an operation of the normal operation mode of the pulse latch circuit 100. When the second selector operates in the "To stop an output" pattern among the three operation patterns, since the second latch circuit is disabled, the power consumption is reduced.

In FIG. 2, for example, in order to express that the latch data Q of the first latch circuit 120 at the time of the third operation mode corresponds to the first input data D1, "(D1)" is attached to the latch data Q. Other data are also the same.

The test pattern data SIN is outputted from the first selector 110 during the first operation mode (i.e., the scan shift mode). The test pattern data SIN is latched by the first latch circuit 120 according to the first pulse clock CLK1, and the latch data Q is outputted from the first latch circuit 120. The latch data Q is outputted from the second selector 130. The latch data Q passes through the second latch circuit 140 and is outputted from the second latch circuit 140 as the scan output data SOUT during the third operation mode (i.e., the scan shift mode). In other words, in the scan shift mode, the second latch circuit 140 maintains the through state.

In this way, during the scan shift mode, the test pattern data SIN inputted into the first selector 110 is latched by the first latch circuit 120, and the latch data Q of the first latch circuit 120 passes through the second latch circuit 140, and is outputted as the scan output data SOUT. Thereby, the scan shift operation of the pulse latch circuit 100 is achieved.

The first input data D1 is outputted from the first selector 110 during the second operation mode. The first input data D1 is latched by the first latch circuit 120 according to the first pulse clock CLK1. The latch data Q is outputted from the first latch circuit 120. Unlike the scan shift mode, the output of the second selector 130 is the second input data D2 inputted from the data input terminal of the second selector 130. The second input data D2 which is outputted from the second selector 130 is latched by the second latch circuit 140 according to the second pulse clock CLK2 supplied from the control circuit 150. The latch data Q2 is outputted from the second latch circuit 140. The second pulse clock CLK2 may be generated by adding the predetermined delay to the first pulse clock CLK1 by the control circuit 150.

In the second operation mode, the first latch circuit 120 latches the first input data D1 according to the first pulse clock CLK1 to obtain the latch data Q, and the second latch circuit 140 latches the second input data D2 according to the second pulse clock CLK2 to obtain the latch data Q2. When the first input data D1 and the second input data D2 are same data, which means the same data is inputted to the first and second selectors 110 and 130 respectively, the latch data Q and the latch data Q2 are obtained by latching the same input data by two latch circuits 120 and 140 whose delay amounts differ, respectively.

By connecting an output of the circuit to be tested to the first selector 110 and the second selector 130 so that the output of the circuit to be tested is inputted to both selectors 110, 130, and by operating the latch circuit 100 in the second operation mode, the first latch circuit 120 and the second latch circuit 140 latch the output of the circuit to be tested with the different delay amounts, respectively. The difference of the delay amounts between the first and the second latch circuits 120, 140 corresponds to a phase difference between the first and second clock signals CLK1, CLK2.

As described above, the three kinds of operation modes, the normal, scan shift, and deterioration detection operation modes, are performed by one latch circuit, i.e., the latch circuit 100. Hereafter, the second operation mode and third operation mode are also called a "deterioration detection mode" and a "normal operation mode", respectively.

First Exemplary Embodiment

Figure 3:
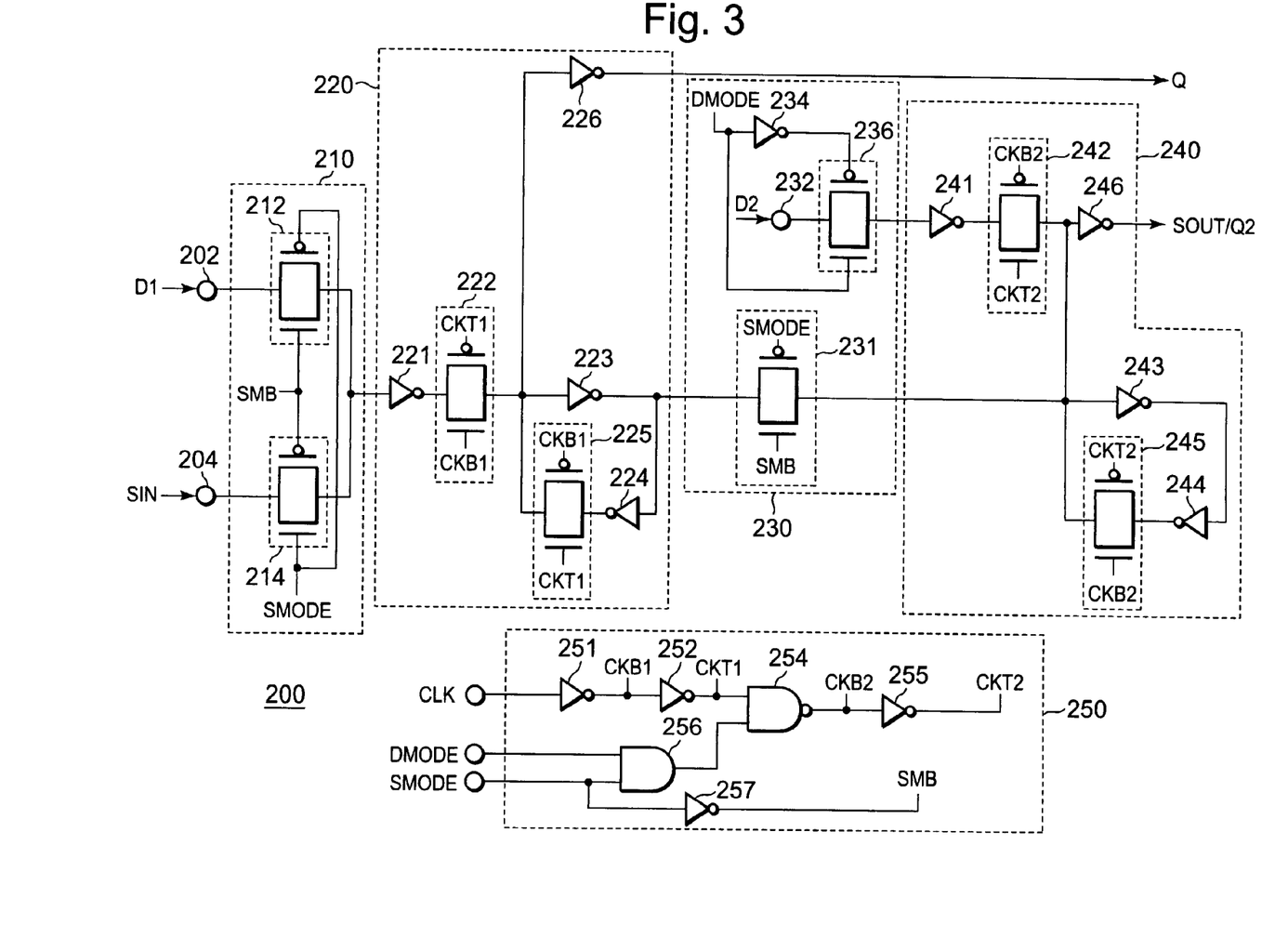
FIG. 3 is an exemplary block diagram of the pulse latch circuit of a first exemplary embodiment of the present invention.

FIG. 3 shows a pulse latch circuit 200 according to a first exemplary embodiment of the present invention. The pulse latch circuit 200 includes a first selector 210, a first latch circuit 220, a second selector 230, a second latch circuit 240, and a control circuit 250. Each of the functional blocks may include the similar functions as corresponding ones shown in FIG. 1.

The control circuit 250 includes an inverter 251, an inverter 252, a NAND gate 254, an inverter 255, an AND gate 256, and an inverter 257.

The inverter 251 inverts the pulse clock CLK to generate a pulse clock CKB1. The inverter 252 inverts the pulse clock CKB1 to generate a pulse clock CKT1. The pulse clock CKT1 is inputted into the NAND gate 254.

The AND gate 256 inputs a first mode selection signal "SMODE" and a second mode selection signal "DMODE", and outputs a logical product of them to the NAND gate 254.

The NAND gate 254 generates a pulse clock CKB2 from the pulse clock CKT1 and an output of the AND gate 256. The inverter 255 inverts the pulse clock CKB2 to generate a pulse clock CKT2. In addition, CKB2 and CKT2 become a pulse clock signal only when both the first mode selection signal "SMODE" and second mode selection signal "DMODE" are High, and although CKB2 and CKT2 stay in High state when either one of the first mode selection signal "SMODE" or second mode selection signal "DMODE" is Low, for convenience of a description, any case is called a "pulse clock".

The inverter 257 inverts the first mode selection signal "SMODE" to obtain an inversion signal "SMB". Although details will be mentioned later, since the inversion signal "SMB" may function as a scan enable signal, it is called the "scan enable signal" hereafter.

The pulse clock "CLK", the first mode selection signal "SMODE", the second mode selection signal "DMODE" which are inputted into the control circuit 250, and each of the signals that the control circuit 250 generates from these signals, serves as the operation mode signal "MODE", the first control signal "ctr1", the second control signal "ctr2", the first pulse clock "CLK1", and the second pulse clock "CLK2" which are shown in FIG. 1.

Figure 4:
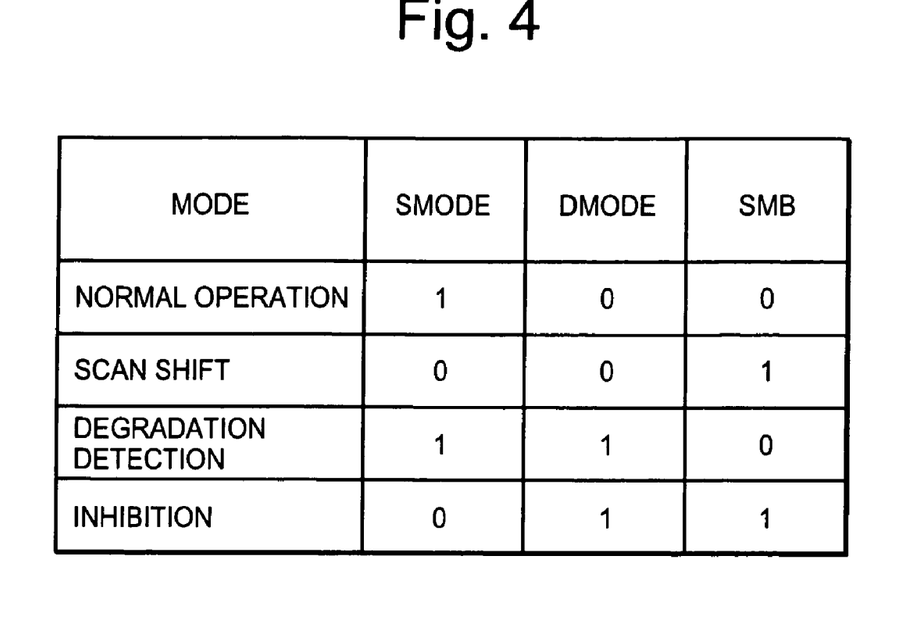
FIG. 4 is an exemplary table showing an exemplary operation mode of the present invention.

As shown in FIG. 4, the first mode selection signal "SMODE", second mode selection signal "DMODE", and scan enable signal "SMB" serve as the operation mode signal "MODE" by a combination of them.

Figure 5:
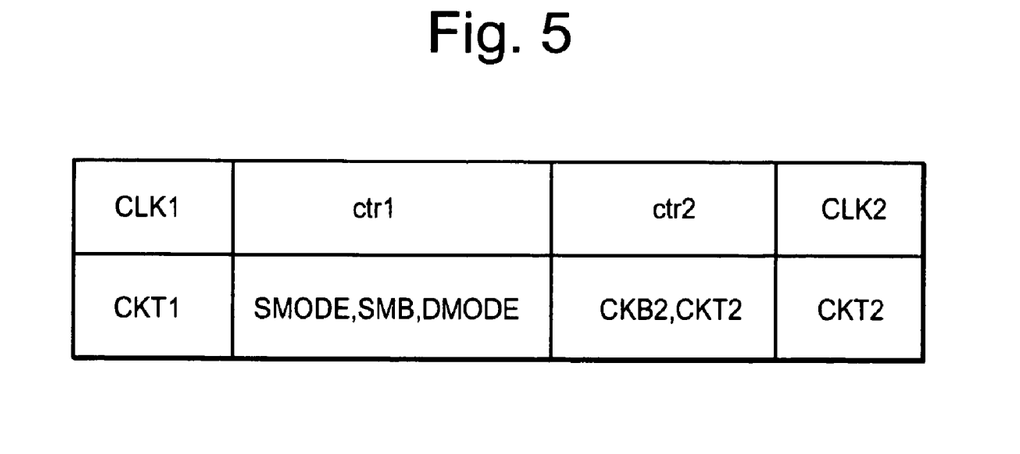
FIG. 5 is an exemplary table for explaining an exemplary operation mode of the present invention.

As shown in FIG. 5, the pulse clock "CKT1" serves as the first pulse clock CLK1, and the pulse clock "CKT2" serves as the second pulse clock CLK2. The combination of the first mode selection signal "SMODE", the scan enable signal "SMB", and the second mode selection signal "DMODE" functions also as a control signal (first control signal "ctr1") of the second selector 230. The combination of the pulse clocks "CKB2" and "CKT2" functions also as a control signal (second control signal "ctr2") of the second latch circuit 240.

The first selector 210 includes two transmission gates 212 and 214, and outputs selectively the first input data D1 and test pattern data SIN according to the scan enable signal "SMB". When the scan enable signal "SMB" is High (i.e., the scan shift mode), the first selector 210 outputs the test pattern data SIN. When the scan enable signal "SMB" is Low (i.e., the normal operation mode or the deterioration detection mode), the first selector 210 outputs the first input data D1.

The first latch circuit 220 includes an inverter 221, a transmission gate 222, an inverter 223, an inverter 224, a transmission gate 225, and an inverter 226, and the pulse clock "CKB1" and pulse clock "CKT1" are supplied from the control circuit 250.

The inverter 221 inverts an output of the first selector 210 to output the inverted signal to the transmission gate 222.

The transmission gate 222 is turned on when the pulse clock "CKT1" is Low, and the transmission gate 222 transmits the output of the first selector 210 to a next stage (i.e., the inverters 223, 224 and the transmission gate 225). When the pulse clock "CKT1" is High, the transmission gate 222 turns off.

The inverter 223, the inverter 224, and the transmission gate 225 form a memory by being given a loop connection. The inverter 223 inverts an output of the transmission gate 222, and the inverter 224 further inverts an output of the inverter 223. The transmission gate 225 is turned off when the transmission gate 222 turns on, and turns on when the transmission gate 222 turns off. Thereby, an operation of latching data which is transmitted from the transmission gate 222 according to the pulse clock CKT1, is achieved.

By the inverter 223 being connected to the second selector 230, the latch data Q of the first latch circuit 220 is inputted into the second selector 230. The inverter 226 outputs the latch data Q to the outside.

The second selector 230 includes a transmission gate 231, an inverter 234, a transmission gate 236, and a second data input terminal 232.

The transmission gate 231 is connected to the first latch circuit 220, and the latch data Q is inputted from the first latch circuit 220. The transmission gate 231 inputs the first mode selection signal "SMODE" and scan enable signal "SMB". The transmission gate 231 may turn on when the scan enable signal SMB is High, and may turn off when the scan enable signal SMB is Low. That is, the transmission gate 231 may output the latch data Q only during the scan shift mode, and may stop an output during other operation modes.

The transmission gate 231 is connected to an output terminal (i.e., "SOUT/Q2") of the second latch circuit 240. In other words, the transmission gate 231 is connected to the output terminal of the second latch circuit 240 so that the output signal of the first latch circuit 220 bypasses transmission gates (i.e., a transmission gate 242, 245) of the second latch circuit 240.

The transmission gate 236 inputs the second mode selection signal "DMODE". The second mode selection signal "DMODE" which is inputted to the transmission gate 236 is inverted by the inverter 234. The transmission gate 236 may output the second input data D2 when the second mode selection signal "DMODE" is High, and may stop outputting the second input data D2 when the second mode selection signal "DMODE" is Low. That is, the transmission gate 236 may transmit the second input data D2 to the second latch circuit 240 only during the deterioration detection mode, and may stop outputting the second input data D2 during other operation modes.

The second selector 230 is controlled by the first mode selection signal "SMODE", the scan enable signal "SMB", and the second mode selection signal "DMODE". The second selector 230 may stop outputting to the second latch circuit 240 during the normal operation mode. The second selector 230 may output the latch data Q of the first latch circuit 220 to the second latch circuit 240 during the scan mode. The second selector 230 may output the second input data D2 to the second latch circuit 240 during the deterioration detection mode.

The second latch circuit 240 includes an inverter 241, the transmission gate 242, an inverter 243, an inverter 244, the transmission gate 245, and an inverter 246. In the deterioration detection mode, the transmission gate 242 and transmission gate 245 are controlled by the pulse clocks "CKB2" and "CKT2" to be turned on or off complementarily.

During the normal operation mode, since the second mode selection signal "DMODE" is Low and the pulse clocks "CKB2" and "CKT2" continue to keep the High level, the transmission gate 242 and transmission gate 245 are still ON. Therefore, the second latch circuit 240 enters into the "through state". However, since an input of data from the second selector 230 is interrupted during the normal operation mode, the second latch circuit 240 is disabled.

The second latch circuit 240 is kept in the through state also during the scan shift mode. Since the latch data Q is outputted from the second selector 230 (i.e., from the transmission gate 231), the scan output data SOUT (=inversion signal of latch data Q) is outputted from the inverter 246 of the second latch circuit 240. In other words, during the scan shift mode, the output signal of the transmission gate 231 bypasses the transmission gates 242 and 245 of the second latch circuit 240.

Since both the first mode selection signal "SMODE" and second mode selection signal "DMODE" are High offering the deterioration detection mode, the "CKT2" and "CKB2" become pulse clocks which are inverted with each other. When the pulse clock "CKT2" is High, the transmission gate 242 turns on, and when the pulse clock CKT2 is Low, the transmission gate 242 turns off.

The second input data D2 is outputted to the inverter 241 from the second selector 230. Since the transmission gate 245 is turned on or off as complementarily as the transmission gate 242, the second latch circuit 240 latches the second input data D2, and the latch data Q2 is outputted from the second latch circuit 240.

Figure 6:
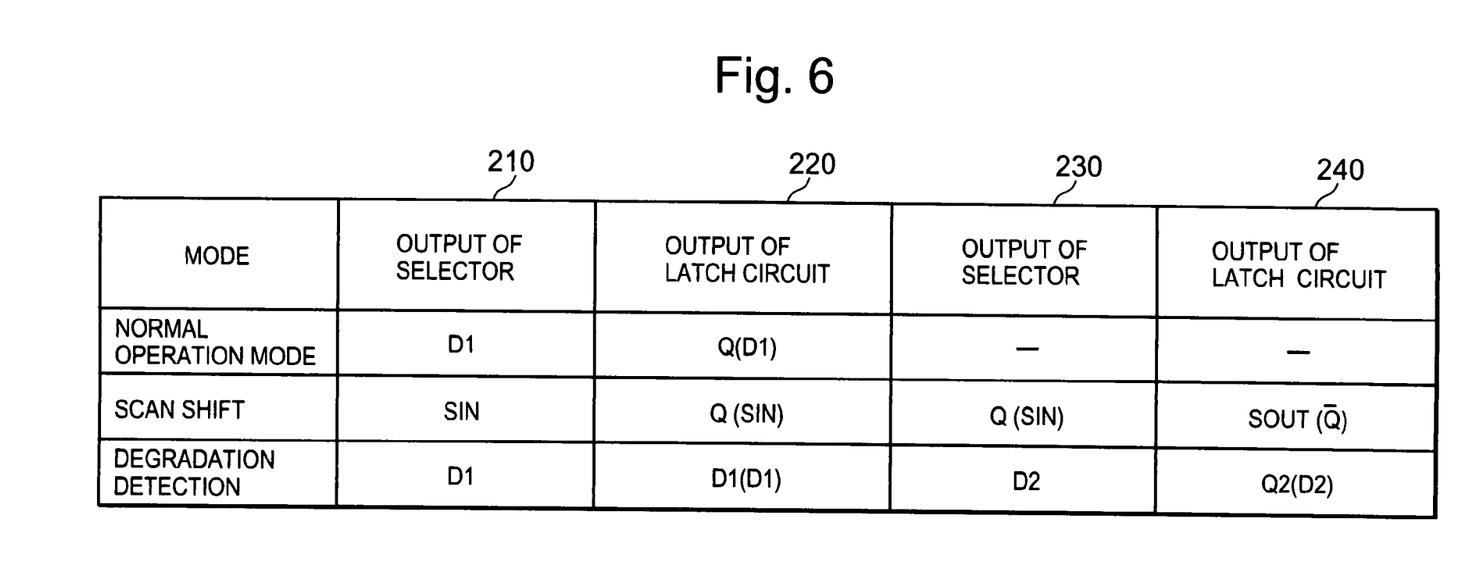
FIG. 6 is an exemplary table showing an exemplary operation mode of the present invention.

FIG. 6 shows each of data which flows through the pulse latch circuit 200 in each operation mode. As shown in FIG. 6, the first input data D1 is outputted from the first selector 210 during the normal operation mode. The first input data D1 is latched by the first latch circuit 220 according to the first pulse clock CLK1, and the latch data Q is outputted from the first latch circuit 220. The second selector 230 may stop outputting to the second latch circuit 240 and thereby the second latch circuit 240 is disabled.

The test pattern data SIN is outputted from the first selector 210 at the time of the scan shift mode. This test pattern data SIN is latched by the first latch circuit 220 with synchronizing with the pulse clock CKT1, and the latch data Q is outputted from the first latch circuit 220. In addition, the latch data Q is outputted from the second selector 230. This latch data Q passes through the second latch circuit 240 maintained in the through state, and is inverted by the inverter 246 to be outputted as the scan output data SOUT from the second latch circuit 240.

The first input data D1 is outputted from the first selector 210 at the time of the deterioration detection mode. This first input data D1 is latched by the first latch circuit 220 with synchronizing with the first pulse clock CLK1, and the latch data Q is outputted from the first latch circuit 220. In addition, the second input data D2 is outputted from the second selector 230. This second input data D2 is latched by the second latch circuit 240 with synchronizing with the pulse clock CKT2, and the latch data Q2 is outputted from the second latch circuit 240.

Figure 7:
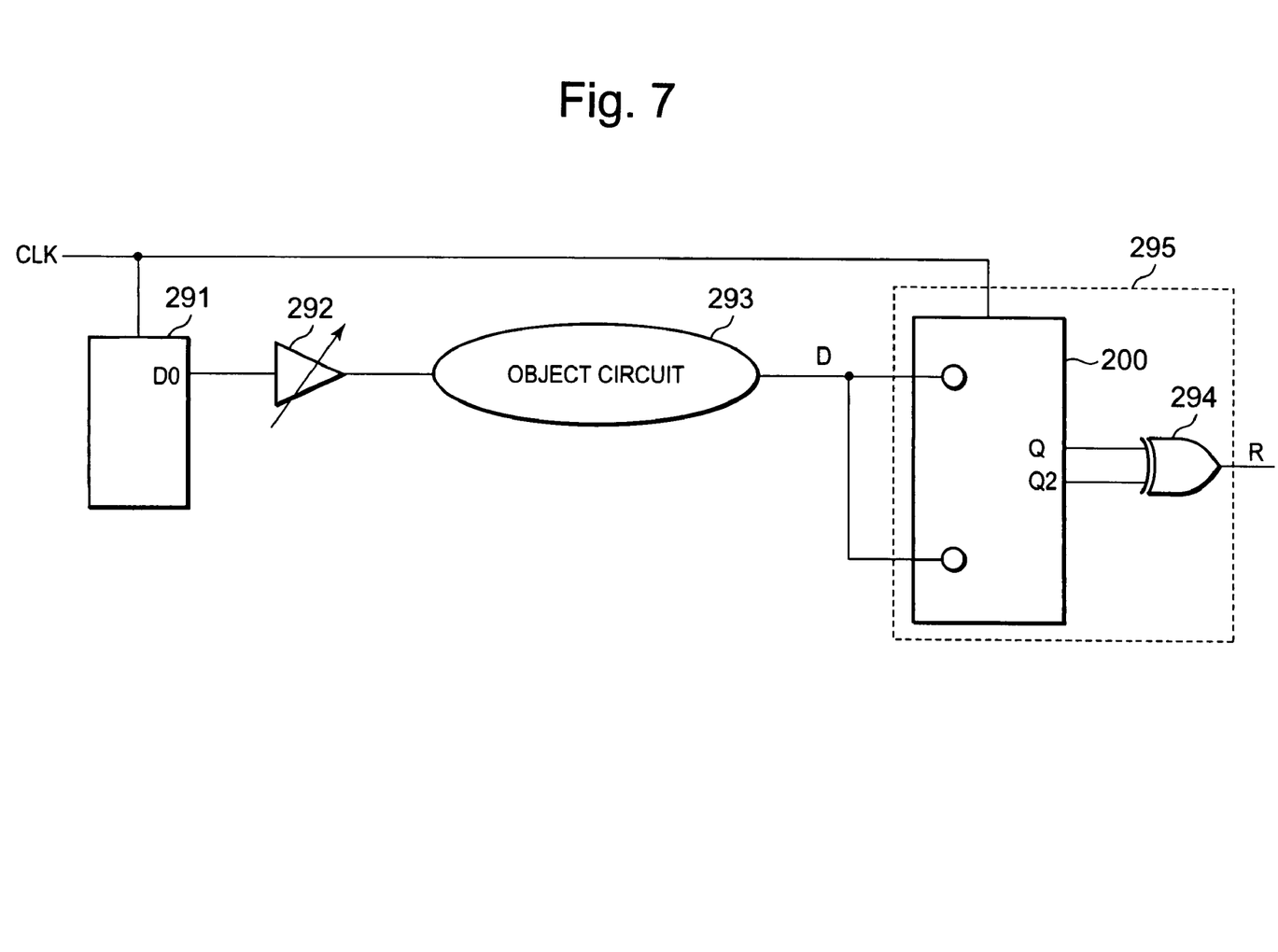
FIG. 7 is an exemplary diagram showing a connection example in the case of applying the pulse latch circuit to deterioration detection.

FIG. 7 shows a connection example at the time when the pulse latch circuit 200 is applied to the deterioration detection of the circuit to be tested. As shown in FIG. 7, the pulse clock "CLK" is inputted into a latch circuit 291 and the pulse latch circuit 200.

The latch circuit 291 latches input data, not shown in FIG. 7, according to the pulse clock "CLK", and outputs latch data D0 to a delay gate 292. The delay gate 292 delays latch data D0 by a predetermined delay amount, to transmit the latch data D0 to the object circuit 293 to be tested. The circuit 293 to be tested processes the latch data DO which is transmitted from the delay gate 292, and outputs the data D.

The data D which is outputted from the circuit 293 to be tested is inputted into a first data input terminal 202 and the second data input terminal 232 of the pulse latch circuit 200. In this case, since the pulse latch circuit 200 is set in the deterioration detection mode, the data D is latched by the first latch circuit 220 and second latch circuit 240. Each of the first and second latch circuit 220, 240 latches the data D with a different delay amount, respectively.

The data D is outputted from the first selector 210 of the pulse latch circuit 200 to the first latch circuit 220, and the latch data Q is outputted from the first latch circuit 220. The data D is outputted also from the second selector 230, and the latch data Q2 is outputted from the second latch circuit 240.

The latch data Q and latch data Q2 are inputted into an XOR gate 294, and an output of the XOR gate 294 becomes a detection result R. In addition, although details will be mentioned later, the XOR gate 294 functions as a comparator which compares whether the latch data Q and latch data Q2 are the same or not. The pulse latch circuit 200 and XOR gate 294 may operate as the deterioration detection circuit 295.

A delay amount of the delay gate 292 is beforehand adjusted so that both the first latch circuit 220 and second latch circuit 240 of the pulse latch circuit 200 may latch the data D.

Since the delay of the circuit 293 to be tested is small while the deterioration of the circuit 293 to be tested is small, both the first latch circuit 220 and second latch circuit 240 may latch the data D, and the detection result R is "0".

As the deterioration of the circuit 293 to be tested becomes larger, the delay also becomes larger. When the delay amount becomes large due to the deterioration, the first latch circuit 220 and the second latch circuit 240 latch different values, respectively. Thus, the latch data Q and latch data Q2 become different values. This will be described with reference to FIG. 8.

Figure 8:
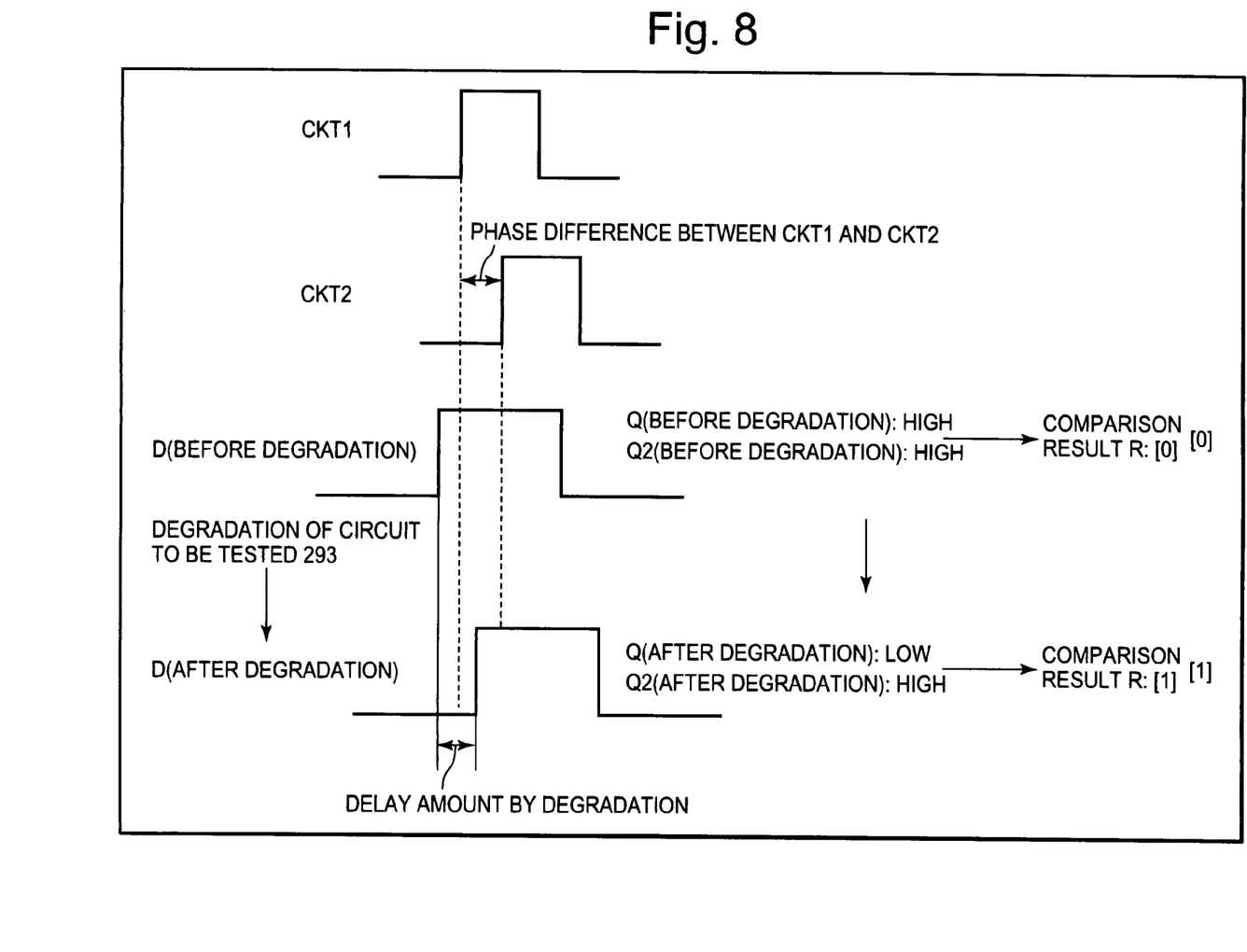
FIG. 8 is an exemplary chart for explaining the deterioration detection.
Figure 9:
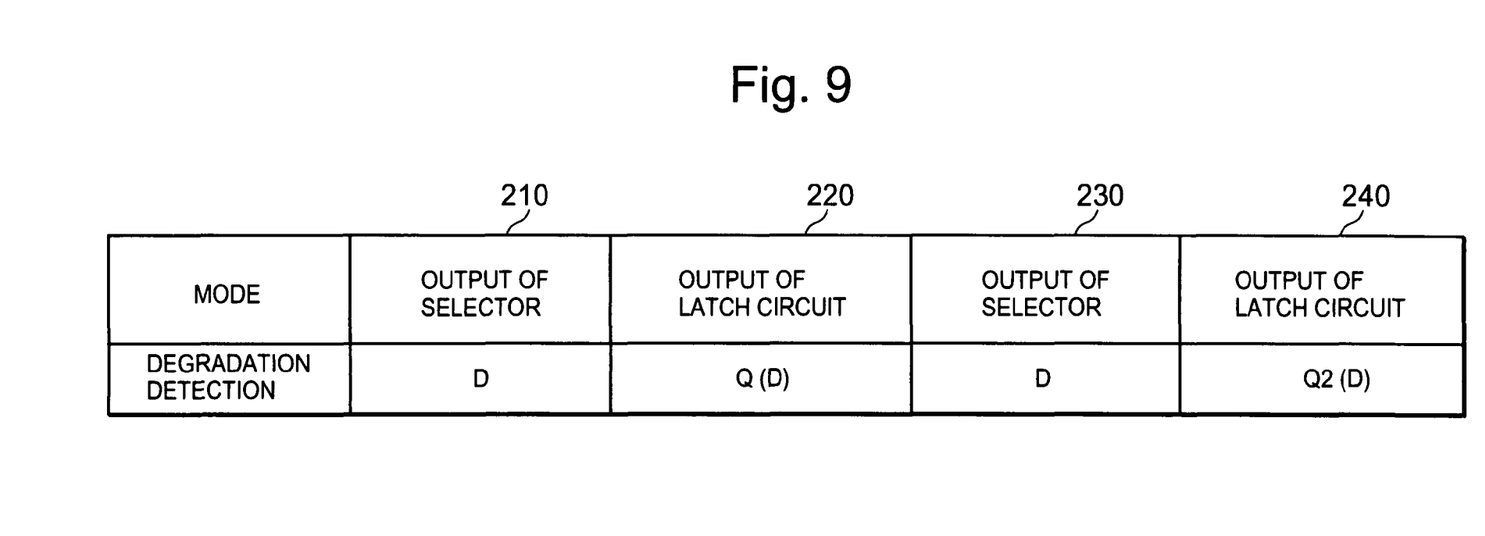
FIG. 9 is an exemplary table showing an exemplary operation mode of the present invention.

As shown in FIG. 8, the pulse clock "CKT1" which is supplied to the first latch circuit 220 and the pulse clock "CKT2" which is supplied to the second latch circuit 240 include a phase difference with each other. At the time of designing the circuit 293 to be tested, the delay gate 292 is adjusted so that the same value may be latched by the first latch circuit 220 and second latch circuit 240. Therefore, the Q and the Q2, which are results of latching the data D before the circuit 293 to be tested is deteriorating by the first latch circuit 220 and the second latch circuit 240, respectively, become the same value. Hence, the comparison result R which is outputted from the XOR gate 294 is set to "0". When the circuit 293 to be tested deteriorates and the delay of the data D increases, the Q and the Q2 may become different values. Hence, the comparison result R which is outputted from the XOR gate 293 becomes "1". When the comparison result R becomes "1", the deterioration of the circuit 293 to be tested is detected.

The difference of delay between the first latch circuit 220 and the second latch circuit 240 may correspond to a phase difference between the pulse clock "CKT2" and pulse clock "CKT1", and it is sum of delay amounts of one NAND gate and one inverter of the control circuit 250.

Thus, the pulse latch circuit 200 may respond also to the deterioration detection by performing a simultaneous input of the same data to the first data input terminal 202 and second data input terminal 232, while being able to perform the normal operation and scan shift.

Since the pulse latch circuit 200 may include 13 inverters, 8 transmission gates, 1 NAND gate, and 1 AND gate, the number of required transistors may be 46.

When using the pulse latch circuit 1, which is shown in FIG. 12 (i.e., the related art), for the deterioration detection, two pulse latch circuits 1 are required, and the number of transistors becomes 80 or more.

On the other hand, the pulse latch circuit 200 of the present invention may perform the deterioration detection by one pulse latch circuit 200, the number of required transistors is 46 when applying the pulse latch circuit 200 to the deterioration detection, and a circuit scale may be remarkably suppressed.

Second Exemplary Embodiment

Figure 10:
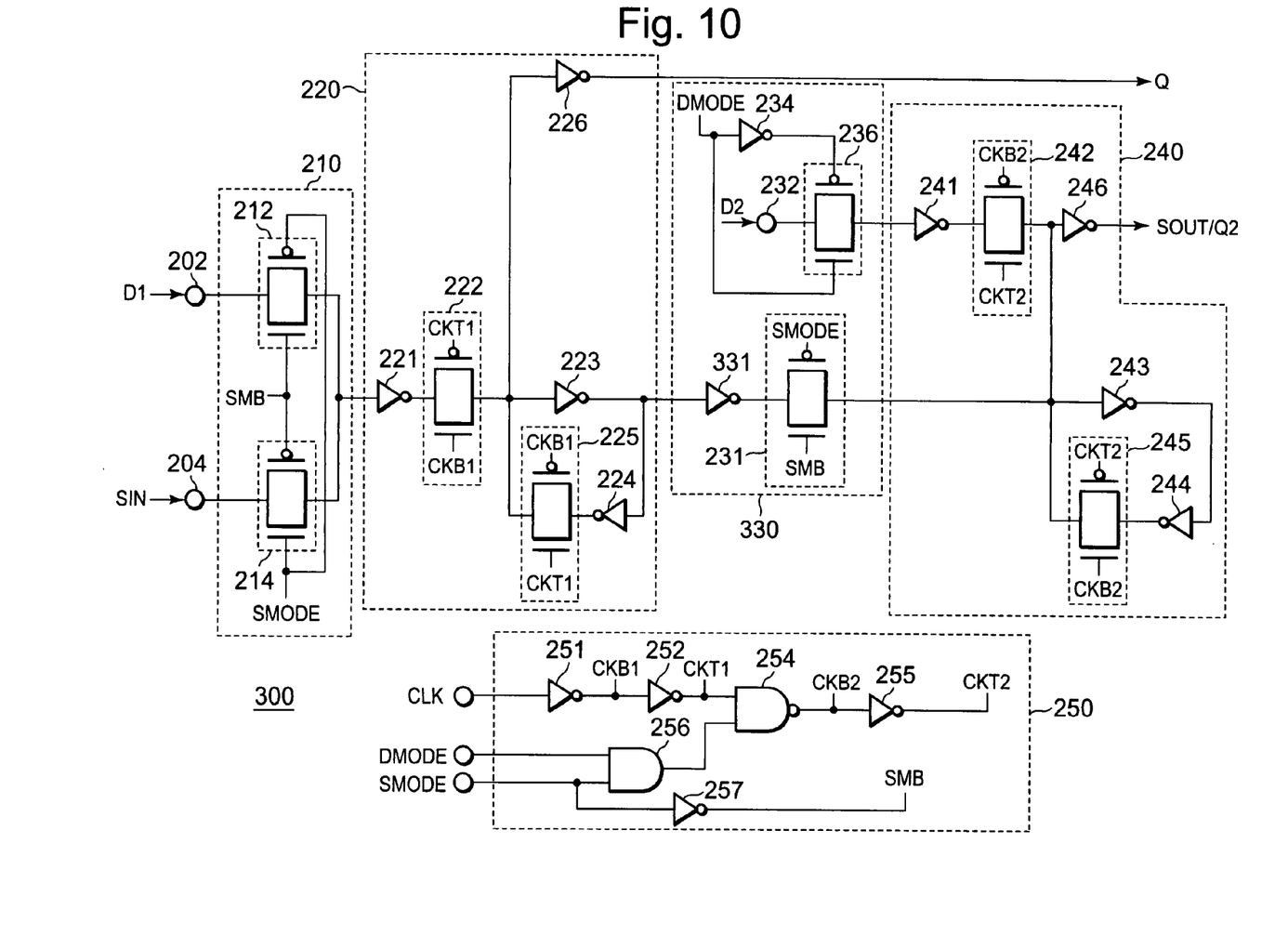
FIG. 10 is an exemplary diagram of the pulse latch circuit according to a second exemplary embodiment of the present invention.

FIG. 10 shows a pulse latch circuit 300 according to a second exemplary embodiment of the present invention. The pulse latch circuit 300 also corresponds to the three operation modes, that is, the normal operation mode, scan shift mode, and deterioration detection mode.

In addition, except that a second selector 330 differs from the second selector 230 of the pulse latch circuit 200 shown in FIG. 1, since other respective components are the same as those of the pulse latch circuit 200, the same reference numerals as those of the pulse latch circuit 200 are assigned to these components in FIG. 10, and detailed descriptions of these are omitted.

The second selector 330 in the pulse latch circuit 300 includes the same construction as the first latch circuit 220 except that the inverter 331 is provided between the transmission gate 231 and first latch circuit 220.

Figure 11:
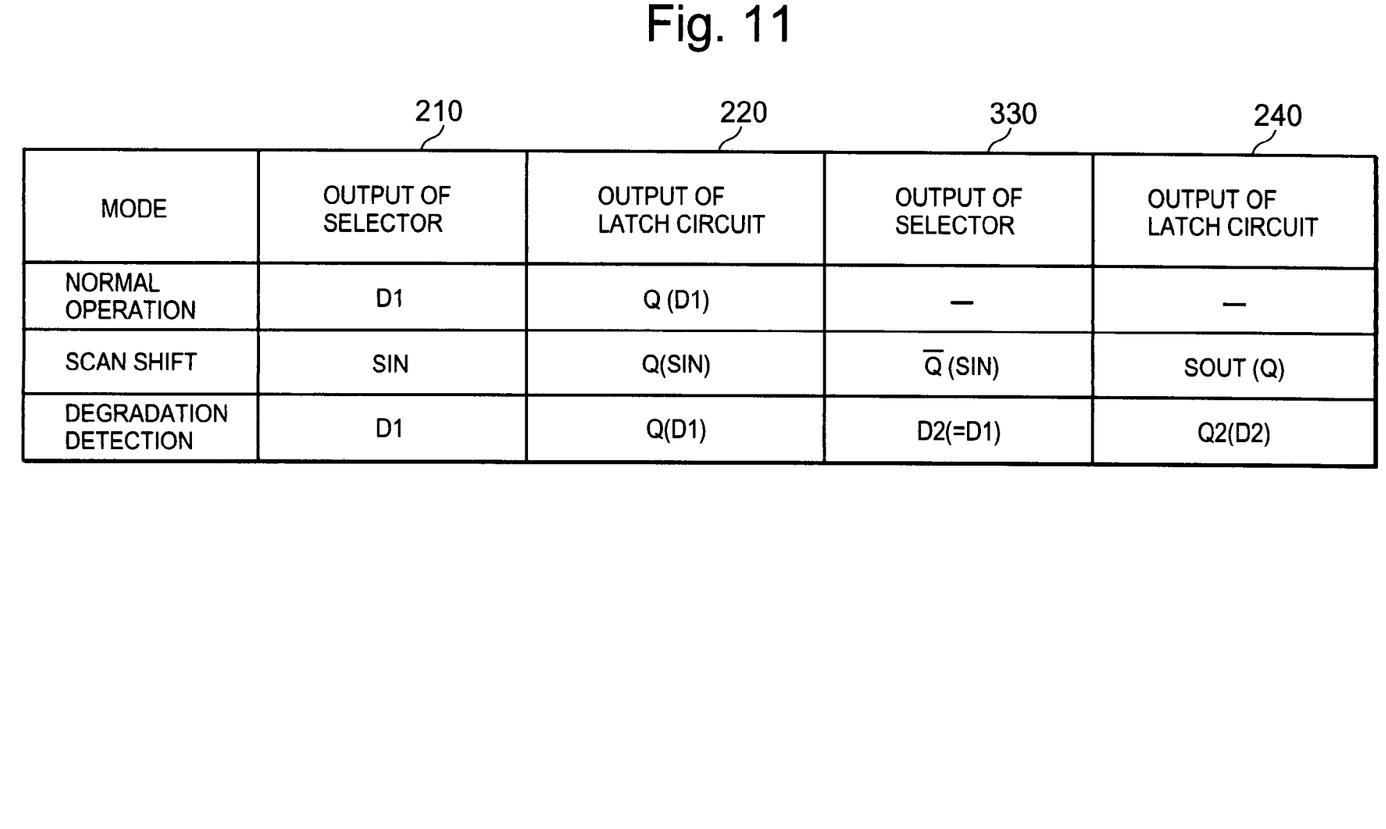
FIG. 11 is an exemplary table showing an exemplary operation of the present invention.

FIG. 11 shows an output of the first selector 210, an output of the first latch circuit 220, an output of the second selector 330, and an output of the second latch circuit 240 in the pulse latch circuit 300 for each of the operation modes.

During the normal operation mode, the pulse latch circuit 300 performs the same operation as the pulse latch circuit 200.

During the scan shift mode, the first selector 210 and first latch circuit 220 perform the same operation as the first selector 210 and first latch circuit 220 in the pulse latch circuit 200. Data of the inverted latch data Q is outputted from the second selector 330. This data is inverted by the inverter 246 when passing through the second latch circuit 240, and is outputted as the scan output data SOUT. In this way, the scan output data SOUT coincides with the latch data Q in terms of a phase.

During the deterioration detection mode, the pulse latch circuit 300 performs the same operation as the pulse latch circuit 200.

The pulse latch circuit 300 also corresponds to the three operation modes similarly to the pulse latch circuit 200. In addition, although the number of required transistors increases by two equivalent to one inverter (inverter 331) and becomes 48, the circuit scale is suppressed at the time of deterioration detection.

While the present invention have been described with reference to the accompanying drawings, it is to be understood that modifications will be apparent to those skilled in the art without departing from the spirit of the invention.

Further, it is noted that applicant's intent is to encompass equivalents of all claim elements, even if amended later during prosecution.

What is claimed is:

1. An apparatus, comprising:
a first selector which selects a test data during a first operation mode, and selects from a first data input terminal during a second, operation mode;
a first latch circuit which latches an output signal of the first selector according to a first clock signal;
a second selector which selects one from a second data input terminal and an output signal of the first latch circuit;
a second latch circuit which latches data from the second data input terminal sent from the second selector according to a second clock signal during the second operation mode, and passes through the output signal of the first latch circuit sent from the second selector during the first operation mode; and
a comparator circuit which compares whether the output signal of the first latch circuit and an output signal of the second latch circuit are same with each other.

2. The apparatus according to claim 1, wherein the first data input terminal and the second data input terminal receive a same data input.

3. The apparatus according to claim 1, wherein the test data is used for a scan shift test.

4. The apparatus according to claim 1, wherein the second clock signal is generated by adding a predetermined delay to the first clock signal.

5. The apparatus according to claim 1, wherein the first and second clock signals comprise pulse shaped wave forms, respectively.

6. The apparatus according to claim 1, wherein the second selector stops an operation during a third operation mode.

7. The apparatus according to claim 1 wherein the second selector comprises a transfer gate which transfers the output signal of the first latch circuit to the second latch circuit,
wherein the transfer gate is connected to an output terminal of the second latch circuit.

8. The apparatus according to claim 1, wherein the second selector comprises a first transfer gate which transfers the output signal of the first latch circuit to the second latch circuit,
wherein the second latch circuit comprises a second transfer gate to latch the data from the second data input terminal, and
wherein the first transfer gate is connected to an output terminal of the second latch circuit so that the output signal of the first latch circuit bypasses the second transfer gate.

9. A circuit, comprising:
a first selector which selects a test data during a first operation mode, and selects an input data during a second operation mode;
a first latch circuit which latches an output signal of the first selector according to a first clock signal;
a second selector which selects one from the input data and an output signal of the first latch circuit;
a second latch circuit which latches the second input data sent from the second selector according to a second clock signal during the second operation mode, and passes through the output signal of the first latch circuit sent from the second selector during the first operation mode; and
a comparator circuit which compares whether the output signal of the first latch circuit and an output signal of the second latch circuit are same with each other.

10. A method, comprising:
selecting a test data during a first operation mode;
selecting a first input data during a second operation mode;
latching a selected signal, the test data or the first input data, according to a first clock signal;
selecting one from a second input data and the latched signal which is latched according to the first clock signal;
latching the selected second input data according to a second clock signal during the second operation mode;
passing through the selected output signal of the first latch circuit during the first operation mode; and
determining whether the latched signal which is latched according to the first clock signal and the latched signal which is latched according to the second signal same with each other.

11. The method according to claim 10, further comprising:
inputting same data as the first input data and the second input data.

12. The method according to claim 10, further comprises using the test data for a scan shift test.

13. The method according to claim 10, further comprises generating the second clock signal by adding a predetermined delay to the first clock signal.

14. The method according to claim 10, further comprises generating the first and second clock signals as pulse shaped wave forms, respectively.

15. The method according to claim 11, further comprises stopping said selecting of one from a second input data and the latched signal which is latched according to the first clock signal, during a third operation mode.

* * * * *